US009362090B2

(12) United States Patent
Honda et al.

(10) Patent No.: US 9,362,090 B2
(45) Date of Patent: Jun. 7, 2016

(54) PLASMA PROCESSING APPARATUS, PLASMA PROCESSING METHOD, AND STORAGE MEDIUM

(75) Inventors: Masanobu Honda, Nirasaki (JP); Yutaka Matsui, Nirasaki (JP); Manabu Sato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1318 days.

(21) Appl. No.: 12/973,563

(22) Filed: Dec. 20, 2010

(65) Prior Publication Data

US 2011/0088850 A1 Apr. 21, 2011

Related U.S. Application Data

(62) Division of application No. 11/689,065, filed on Mar. 21, 2007, now Pat. No. 7,883,632.

(60) Provisional application No. 60/788,090, filed on Apr. 3, 2006, provisional application No. 60/818,526, filed on Jul. 6, 2006.

(30) Foreign Application Priority Data

Mar. 22, 2006 (JP) .................... 2006-079638
Jun. 19, 2006 (JP) .................... 2006-168684

(51) Int. Cl.
*C23C 16/00* (2006.01)
*C23F 1/00* (2006.01)
(Continued)

(52) U.S. Cl.
CPC ....... *H01J 37/32174* (2013.01); *H01J 37/3255* (2013.01); *H01J 37/32091* (2013.01); *H01J 37/32165* (2013.01); *H01J 37/32706* (2013.01);
(Continued)

(58) Field of Classification Search
USPC ............. 156/345.24, 345.28, 345.43–345.47; 118/715, 722, 723 R, 723 E; 315/111.21
See application file for complete search history.

(56) References Cited

U.S. PATENT DOCUMENTS

| 4,420,386 A | 12/1983 | White |
| 4,450,787 A | 5/1984 | Weakliem et al. |

(Continued)

FOREIGN PATENT DOCUMENTS

| JP | 7-106307 | 4/1995 |
| JP | 7-273089 | 10/1995 |

(Continued)

OTHER PUBLICATIONS

Office Action issued Nov. 8, 2011 in Japanese Patent Application No. 2006-168684 (with partial English translation).

*Primary Examiner* — Keath Chen
(74) *Attorney, Agent, or Firm* — Oblon, McClelland, Maier & Neustadt, L.L.P.

(57) ABSTRACT

A plasma processing apparatus that enables polymer to be removed from an electrically insulated electrode. A susceptor of the plasma processing apparatus is disposed in a substrate processing chamber having a processing space therein. A radio frequency power source is connected to the susceptor. An upper electrode plate is electrically insulated from a wall of the substrate processing chamber and from the susceptor. A DC power source is connected to the upper electrode plate. A controller of the plasma processing apparatus determines a value of a negative DC voltage to be applied to the upper electrode plate in accordance with processing conditions for RIE processing to be carried out.

4 Claims, 8 Drawing Sheets

(51) Int. Cl.

| | |
|---|---|
| *H01L 21/306* | (2006.01) |
| *H01J 7/24* | (2006.01) |
| *H05B 31/26* | (2006.01) |
| *H01J 37/32* | (2006.01) |
| *H01L 21/311* | (2006.01) |
| *H01L 21/02* | (2006.01) |
| *H01L 21/67* | (2006.01) |

(52) U.S. Cl.
CPC ..... *H01J 37/32862* (2013.01); *H01J 37/32926* (2013.01); *H01L 21/02532* (2013.01); *H01L 21/31116* (2013.01); *H01L 21/31122* (2013.01); *H01L 21/31138* (2013.01); *H01L 21/31144* (2013.01); *H01L 21/67069* (2013.01)

(56) References Cited

U.S. PATENT DOCUMENTS

| | | |
|---|---|---|
| 5,446,538 A | 8/1995 | Noll |
| 5,556,501 A | 9/1996 | Collins et al. |
| 5,585,012 A * | 12/1996 | Wu et al. ............ 216/71 |
| 5,637,146 A | 6/1997 | Chyi |
| 5,876,808 A | 3/1999 | Hall et al. |
| 5,888,414 A | 3/1999 | Collins et al. |
| 5,895,266 A | 4/1999 | Fu et al. |
| 5,958,510 A | 9/1999 | Sivaramakrishnam et al. |
| 6,068,784 A | 5/2000 | Collins et al. |
| 6,238,803 B1 | 5/2001 | Fu et al. |
| 6,251,792 B1 | 6/2001 | Collins et al. |
| 6,426,299 B1* | 7/2002 | Ikeda ............ 438/700 |
| 6,444,137 B1 | 9/2002 | Collins et al. |
| 6,517,687 B1 | 2/2003 | Iacovangelo |
| 6,518,195 B1 | 2/2003 | Collins et al. |
| 6,524,662 B2 | 2/2003 | Jang et al. |
| 6,545,420 B1 | 4/2003 | Collins et al. |
| 6,709,553 B2 | 3/2004 | Wang et al. |
| 6,818,059 B2 | 11/2004 | Jang et al. |
| 7,022,191 B2 | 4/2006 | Jang et al. |
| 2002/0004309 A1 | 1/2002 | Collins et al. |
| 2003/0052085 A1* | 3/2003 | Parsons ............ 216/60 |
| 2003/0209422 A1 | 11/2003 | Wang et al. |
| 2006/0037703 A1* | 2/2006 | Koshiishi et al. ........ 156/345.47 |
| 2006/0219363 A1 | 10/2006 | Matsumoto et al. |
| 2007/0211402 A1 | 9/2007 | Sawataishi et al. |
| 2007/0234960 A1 | 10/2007 | Honda et al. |
| 2008/0081474 A1 | 4/2008 | Suzuki |

FOREIGN PATENT DOCUMENTS

| | | |
|---|---|---|
| JP | 2001-156041 | 6/2001 |
| JP | 2002-93778 | 3/2002 |
| JP | 2006-66905 | 3/2006 |
| KR | 1998-038687 | 8/1998 |
| WO | WO 2005/124844 A1 | 12/2005 |
| WO | WO 2005124844 A1 * | 12/2005 |

* cited by examiner

PLASMA PROCESSING APPARATUS, PLASMA PROCESSING METHOD, AND STORAGE MEDIUM

CROSS-REFERENCE TO RELATED APPLICATION

The present application is a divisional application of U.S. application Ser. No. 11/689,065, filed Mar. 21, 2007, which issued as U.S. Pat. No. 7,883,632 on Feb. 8, 2011, and which is incorporated herein by reference in its entirety. U.S. application Ser. No. 11/689,065 is based upon U.S. Provisional Application Nos. 60/788,090, filed Apr. 3, 2006, and 60/818,526, filed Jul. 6, 2006, and claims priority under 35 U.S.C. §119 to Japanese Patent Application Nos. 2006-168684, filed Jun. 19, 2006, and 2006-079638, filed Mar. 22, 2006.

BACKGROUND OF THE INVENTION

1. Field of the Invention

The present invention relates to a plasma processing apparatus, a plasma processing method, and a storage medium, and in particular relates to a plasma processing apparatus having an electrode that is electrically insulated from other component elements.

2. Description of the Related Art

Parallel plate type plasma processing apparatuses are known that have a substrate processing chamber that has therein a processing space into which is transferred a wafer as a substrate, a lower electrode that is disposed in the substrate processing chamber and is connected to a radio frequency power source, and an upper electrode that is disposed such as to face the lower electrode. In such a plasma processing apparatus, a processing gas is introduced into the processing space, and radio frequency electrical power is applied into the processing space between the upper electrode and the lower electrode. When a wafer has been transferred into the processing space and mounted on the lower electrode, the introduced processing gas is turned into plasma through the radio frequency electrical power so as to produce ions and so on, and the wafer is subjected to plasma processing, for example etching processing, by the ions and so on.

In the case of forming the plasma by introducing a CF type processing gas into the processing space as the processing gas, a CF type reaction product is produced in the processing space, and becomes attached as polymer to a surface of each of the upper electrode and the lower electrode, and an inner wall surface of the substrate processing chamber. Here, because radio frequency electrical power is supplied to each of the upper electrode and the lower electrode, a potential on the surface of each of the upper electrode and the lower electrode fluctuates, and hence a potential difference arises between the plasma in the processing space and the surface of each of the upper electrode and the lower electrode. Ions collide with the surface of each of the upper electrode and the lower electrode in accordance with the potential difference, whereby the polymer attached to the surface is removed. Moreover, the wall of the substrate processing chamber is generally grounded, and hence a potential difference arises between the plasma in the processing space and the inner wall surface of the substrate processing chamber. Polymer attached to the inner wall surface is thus also removed through collisions with ions.

There is also known a plasma processing apparatus in which a dust-collecting electrode is disposed in the processing space so as to reliably prevent polymer from becoming attached to the surface of each of the upper electrode and the lower electrode, and the inner wall surface of the substrate processing chamber. In such a plasma processing apparatus, a DC voltage is applied to the dust-collecting electrode, whereby the dust-collecting electrode electrostatically attracts and thus captures reaction product in the processing space (see, for example, Japanese Laid-open Patent Publication (Kokai) No. H07-106307).

Moreover, in recent years, as semiconductor devices have become increasingly highly integrated, patterns formed on wafers have been made finer. Such making semiconductor devices finer is achieved by reducing the light source wavelength of an exposing apparatus used in photolithography, and at present it has come to be that an argon fluoride (ArF) excimer laser of wavelength 0.193 µm is used as the light source.

For a photoresist film (ArF resist film) used in photolithography using such an ArF excimer laser, the etching selectivity thereof relative to a semiconductor device constituent material is insufficient, and hence it is difficult to etch the constituent material accurately using a single layer of such an ArF resist film as a mask.

Moreover, as patterns are made finer, it becomes impossible to make the photoresist film thick. It is thus difficult to achieve the high etching selectivity required of the photoresist film relative to the semiconductor device constituent material.

As an example of a process for solving such problems, multi-layer resist processes have thus been developed. A multi-layer resist process is a process in which, to improve the functioning as a mask material in etching of the constituent material, the resist is made to be multi-layer, whereby the target layer can be precisely processed.

Such a multi-layer resist process is described, for example, in Japanese Laid-open Patent Publication (Kokai) No. 2002-093778. Following is a brief description of the multi-layer resist process described in Japanese Laid-open Patent Publication (Kokai) No. 2002-093778.

First, on a semiconductor device constituent material (a silicon oxide film type insulating film, e.g. $SiO_2$), there are formed in order a lower layer resist film (a coating type carbon film, e.g. amorphous carbon) that can be selectively etched relative to the constituent material, an oxide film (SOG film, e.g. $SiO_2$ or SiOC) that can be selectively etched relative to the lower layer resist film, and a photoresist film.

Next, the photoresist film is patterned by photolithography, and the oxide film (inorganic film) is etched using the photoresist film as a mask, thus transferring the pattern of the photoresist film onto the oxide film. Next, the lower layer resist film (organic film) is etched using the patterned oxide film as a mask, thus transferring the pattern of the oxide film onto the lower layer resist film. Processing of the constituent material (inorganic film) is then carried out using the lower layer resist film as a mask.

Here, in an etching apparatus for the insulating film, from the viewpoint of improving efficiency, it is required that both the inorganic film etching of the silicon oxide film type insulating film which is made of a silicon-based material such as $SiO_2$, and the organic film etching of the coating type carbon film which is made of a carbon-based material such as amorphous carbon be carried out in the same chamber. In the etching of the $SiO_2$ material, a CF type gas such as $C_4F_8$ is mainly used, and to achieve a high etching rate, an etching apparatus that enables high-electron-density high-bias etching to be achieved is required. On the other hand, in the organic film etching, a gas not containing F such as $O_2$, CO, N₂, or H₂ is used, and an etching apparatus that enables high-electron-density low-bias etching to be achieved is required.

Meanwhile, in recent years, so that the plasma in the processing space can be controlled to be in a desired state, plasma processing apparatuses in which radio frequency electrical power is not supplied to the upper electrode have been developed. In such a plasma processing apparatus, the upper electrode is electrically insulated from the wall of the substrate processing chamber, and hence the radio frequency electrical power supplied to the lower electrode is not supplied into the upper electrode via the wall, which is grounded. Moreover, the upper electrode receives charge from the plasma, but there is no outflow of the charge from the upper electrode, and hence the upper electrode is charged up, whereby a potential difference between a surface of the upper electrode and the plasma in the processing space is reduced. The energy of ions colliding with the surface of the upper electrode is thus reduced, and hence polymer that has become attached to the surface of the upper electrode cannot be removed.

In the case that the polymer attached to the surface of the upper electrode is not removed, problems arise, for example the polymer detaches to form particles, which become attached to the front surface of wafers, causing a worsening of the yield of semiconductor devices manufactured from the wafers.

Moreover, in the case of using, as an etching apparatus that carries out a multi-layer resist process as described above, an apparatus that has a silicon-based upper electrode and in which radio frequency electrical power is applied into the processing space from each of the upper electrode and the lower electrode, it is known that if the silicon-based upper electrode is sputtered in the inorganic film processing, then even if high-electron-density plasma is used, a high selectivity relative to the photoresist acting as the mask film can be achieved. However, in the organic film processing, a problem arises that, upon radio frequency electrical power being applied to the upper electrode, the silicon-based upper electrode material flies off due to sputtering and accumulates on the wafer. Because the processing gas supplied into the processing space in the organic film processing is a gas not containing F, the silicon-based material accumulated on the wafer cannot be removed, but rather accumulates as residue.

In the case that an apparatus in which radio frequency electrical power is applied from only the lower electrode is used, the above problem does not arise. However, in the inorganic film processing, because the effect of the silicon-based upper electrode being sputtered is not obtained, in the case that high-electron-density plasma is used, a problem of the photoresist selectivity decreasing arises.

SUMMARY OF THE INVENTION

The present invention provides a plasma processing apparatus, a plasma processing method, and a storage medium, which enable polymer to be removed from an electrically insulated electrode.

The present invention provides a plasma processing apparatus, a plasma processing method, and a storage medium, which enable a continuous process comprising inorganic film processing and organic film processing to be carried out on a substrate.

In a first aspect of the present invention, there is provided a plasma processing apparatus comprising a substrate processing chamber that has therein a processing space into which a substrate is transferred and is configured to carry out plasma processing on the substrate in the processing space, a first electrode that is disposed in the substrate processing chamber and is connected to a radio frequency power source, and a second electrode that has an exposed portion exposed to the processing space and is electrically insulated from the substrate processing chamber and the first electrode, wherein the second electrode is connected to a DC power source.

According to the plasma processing apparatus of the present invention, a DC voltage is applied to the second electrode which has an exposed portion exposed to the processing space and is electrically insulated from the substrate processing chamber and the first electrode. As a result, a potential difference is produced between plasma in the processing space and the exposed portion of the second electrode, and hence ions collide with the exposed portion of the second electrode. Polymer can thus be removed from the electrically insulated second electrode.

The plasma processing apparatus can further comprise a controller configured to control a value of a DC voltage applied to the second electrode, wherein the controller is configured to determine the value of the applied DC voltage in accordance with an amount of deposit attached to the exposed portion.

In this case, the value of the DC voltage applied to the second electrode is determined in accordance with the amount of deposit attached to the exposed portion. As a result, polymer can be suitably removed from the second electrode.

The plasma processing apparatus can further comprise a controller configured to control a value of a DC voltage applied to the second electrode, wherein the controller is configured to determine the value of the applied DC voltage in accordance with at least one of a type of a gas introduced into the processing space, a magnitude of radio frequency electrical power supplied to the first electrode, and a pressure in the processing space.

In this case, the value of the DC voltage applied to the second electrode is determined in accordance with at least one of the type of the gas introduced into the processing space, the magnitude of radio frequency electrical power supplied to the first electrode, and the pressure in the processing space. The amount of deposit attached to the exposed portion of the second electrode is related to the at least one of the above gas type, the above radio frequency electrical power magnitude, and the above pressure. As a result, polymer can be suitably removed from the second electrode.

The DC power source can apply a DC voltage to the second electrode at least while the radio frequency power source is supplying radio frequency electrical power to the first electrode.

In this case, the DC voltage is applied to the second electrode at least while the radio frequency power source is supplying the radio frequency electrical power to the first electrode. While the radio frequency power source is supplying the radio frequency electrical power to the first electrode, plasma is produced in the processing space and hence reaction product is produced. However, even if this reaction product becomes attached to the exposed portion of the second electrode, the reaction product is removed therefrom through collisions with ions due to the potential difference between the plasma in the processing space and the exposed portion of the second electrode. As a result, polymer can be reliably removed from the second electrode.

The DC power source can apply a DC voltage to the second electrode at least while plasma is being produced in the processing space.

In this case, the DC voltage is applied to the second electrode at least while the plasma is being produced in the processing space. While the plasma is being produced in the processing space, reaction product is produced in the processing space. However, even if this reaction product becomes attached to the exposed portion of the second electrode, the reaction product is removed therefrom through collisions with ions due to the potential difference between the plasma in the processing space and the exposed portion of the second electrode. As a result, polymer can be reliably removed from the second electrode.

In a second aspect of the present invention, there is provided a plasma processing method for a plasma processing apparatus having a substrate processing chamber that has therein a processing space into which a substrate is transferred and is configured to carry out plasma processing on the substrate in the processing space, a first electrode that is disposed in the substrate processing chamber and is connected to a radio frequency power source, and a second electrode that has an exposed portion exposed to the processing space and is electrically insulated from the substrate processing chamber and the first electrode, the method comprising a DC voltage application step of applying a DC voltage to the second electrode.

The plasma processing method can further comprise a voltage value determining step of determining a value of the DC voltage applied to the second electrode in accordance with an amount of deposit attached to the exposed portion.

The plasma processing method can further comprise a voltage value determining step of determining a value of the DC voltage applied to the second electrode in accordance with at least one of a type of a gas introduced into the processing space, a magnitude of radio frequency electrical power supplied to the first electrode, and a pressure in the processing space In the DC voltage application step, the DC voltage can be applied to the second electrode at least while the radio frequency power source is supplying radio frequency electrical power to the first electrode.

In the DC voltage application step, the DC voltage can be applied to the second electrode at least while plasma is being produced in the processing space.

In a third aspect of the present invention, there is provided a computer-readable storage medium storing a program for causing a computer to implement a plasma processing method for a plasma processing apparatus having a substrate processing chamber that has therein a processing space into which a substrate is transferred and is configured to carry out plasma processing on the substrate in the processing space, a first electrode that is disposed in the substrate processing chamber and is connected to a radio frequency power source, and a second electrode that has an exposed portion exposed to the processing space and is electrically insulated from the substrate processing chamber and the first electrode, the method comprising a DC voltage application step of applying a DC voltage to the second electrode.

In a fourth aspect of the present invention, there is provided a plasma processing apparatus comprising a substrate processing chamber that has therein a processing space into which a substrate is transferred and is configured to carry out plasma processing on the substrate in the processing space, a first electrode that is disposed in the substrate processing chamber and is connected to a radio frequency power source, and a second electrode that has an exposed portion exposed to the processing space and is electrically insulated from the substrate processing chamber and the first electrode, wherein the substrate has an inorganic film and an organic film formed thereon, wherein when plasma processing is being carried out on the inorganic film on the substrate, a potential difference between the processing space and the second electrode is set to a value at which the exposed portion of the second electrode is sputtered by plasma produced in the processing space, and wherein when plasma processing is being carried out on the organic film on the substrate, the potential difference between the processing space and the second electrode is set to a value lower than the value of the potential difference for when the plasma processing is being carried out on the inorganic film.

According to this plasma processing apparatus, when plasma processing is being carried out on the inorganic film on the substrate having the inorganic film and the organic film formed thereon, the potential difference between the processing space and the second electrode is set to a value at which the exposed portion of the second electrode is sputtered by plasma produced in the processing space, and when plasma processing is being carried out on the organic film on the substrate, the potential difference between the processing space and the second electrode is set to a value lower than the value of the potential difference for when the plasma processing is being carried out on the inorganic film. As a result, in the inorganic film processing, the exposed portion of the second electrode is sputtered, whereby high selectivity relative to a resist film can be secured in etching of the inorganic film. On the other hand, in the organic film processing, the potential difference between the plasma in the processing space and the exposed portion of the second electrode is reduced, and hence the exposed portion of the second electrode is not sputtered, whereby residue can be prevented from being produced on the substrate in etching of the organic film. An inorganic film processing process and an organic film processing process can thus be carried out on the substrate as a continuous process in the same plasma processing apparatus.

The second electrode can be connected to a DC power source.

In this case, the second electrode is connected to a DC power source. As a result, the potential difference between the plasma in the processing space and the exposed portion of the second electrode can be reliably set to a desired potential.

The plasma processing apparatus can further comprise a switching device disposed between the second electrode and the DC power source, wherein when the plasma processing is being carried out on the organic film on the substrate, the switching device cuts off electrical connection between the second electrode and the DC power source so as to electrically insulate the second electrode.

In this case, when the plasma processing is being carried out on the organic film on the substrate, electrical connection between the second electrode and the DC power source is cut off so as to electrically insulate the second electrode. As a result, the potential difference between the plasma in the processing space and the exposed portion of the second electrode can be reliably made to be lower than the potential difference for when the plasma processing is being carried out on the inorganic film.

The second electrode can be grounded when the plasma processing is being carried out on the inorganic film on the substrate.

In this case, when the plasma processing is being carried out on the inorganic film on the substrate, the second electrode is grounded. As a result, the potential difference between the plasma in the processing space and the exposed portion of the second electrode can be easily set to a value at which the exposed portion of the second electrode is sputtered.

Radio frequency electrical power of frequency not more than 27 MHz that produces a desired DC voltage can be applied to the second electrode when the plasma processing is being carried out on the inorganic film on the substrate.

In this case, when the plasma processing is being carried out on the inorganic film on the substrate, radio frequency electrical power of frequency not more than 27 MHz that produces a desired DC voltage is applied to the second electrode. As a result, the potential difference between the plasma in the processing space and the exposed portion of the second electrode can be reliably set to a value at which the exposed portion of the second electrode is sputtered.

The second electrode can be electrically insulated when the plasma processing is being carried out on the organic film on the substrate.

In this case, when the plasma processing is being carried out on the organic film on the substrate, the second electrode is electrically insulated. As a result, the exposed portion of the second electrode receives charge from the plasma in the processing space, but there is no outflow of the charge from the exposed portion, and hence the exposed portion is charged up. The potential difference between the plasma in the processing space and the exposed portion of the second electrode can thus be reliably reduced.

The exposed portion can comprise a silicon-based material.

In this case, the exposed portion of the second electrode comprises a silicon-based material. As a result, when the exposed portion of the second electrode is sputtered during the inorganic film processing, high selectivity relative to a resist film can be secured in the etching of the inorganic film.

In a fifth aspect of the present invention, there is provided a plasma processing method for a plasma processing apparatus having a substrate processing chamber that has therein a processing space into which a substrate is transferred and is configured to carry out plasma processing on the substrate in the processing space, a first electrode that is disposed in the substrate processing chamber and is connected to a radio frequency power source, and a second electrode that has an exposed portion exposed to the processing space and is electrically insulated from the substrate processing chamber and the first electrode, the substrate having an inorganic film and an organic film formed thereon, the method comprising an inorganic film processing step of carrying out plasma processing on the inorganic film on the substrate, and an organic film processing step of carrying out plasma processing on the organic film on the substrate, wherein in the inorganic film processing step, a potential difference between the processing space and the second electrode is set to a value at which the exposed portion of the second electrode is sputtered by plasma produced in the processing space, and in the organic film processing step, the potential difference between the processing space and the second electrode is set to a value lower than the value of the potential difference for when the plasma processing is being carried out on the inorganic film.

The plasma processing method can further comprise a DC power source connection step of connecting a DC power source to the second electrode.

In the inorganic film processing step, the second electrode can be grounded.

In the inorganic film processing step, radio frequency electrical power of frequency not more than 27 MHz that produces a desired DC voltage can be applied to the second electrode.

In the organic film processing step, the second electrode can be electrically insulated.

The exposed portion can comprise a silicon-based material.

In a sixth aspect of the present invention, there is provided a computer-readable storage medium storing a program for causing a computer to implement a plasma processing method for a plasma processing apparatus having a substrate processing chamber that has therein a processing space into which a substrate is transferred and is configured to carry out plasma processing on the substrate in the processing space, a first electrode that is disposed in the substrate processing chamber and is connected to a radio frequency power source, and a second electrode that has an exposed portion exposed to the processing space and is electrically insulated from the substrate processing chamber and the first electrode, the substrate having an inorganic film and an organic film formed thereon, the method comprising an inorganic film processing step of carrying out plasma processing on the inorganic film on the substrate, and an organic film processing step of carrying out plasma processing on the organic film on the substrate, wherein in the inorganic film processing step, a potential difference between the processing space and the second electrode is set to a value at which the exposed portion of the second electrode is sputtered by plasma produced in the processing space, and in the organic film processing step, the potential difference between the processing space and the second electrode is set to a value lower than the value of the potential difference for when the plasma processing is being carried out on the inorganic film.

Further features of the present invention will become apparent from the following description of exemplary embodiments with reference to the attached drawings.

DETAILED DESCRIPTION OF THE PREFERRED EMBODIMENTS

The present invention will now be described in detail below with reference to the drawings showing preferred embodiments thereof.

Figure 1:
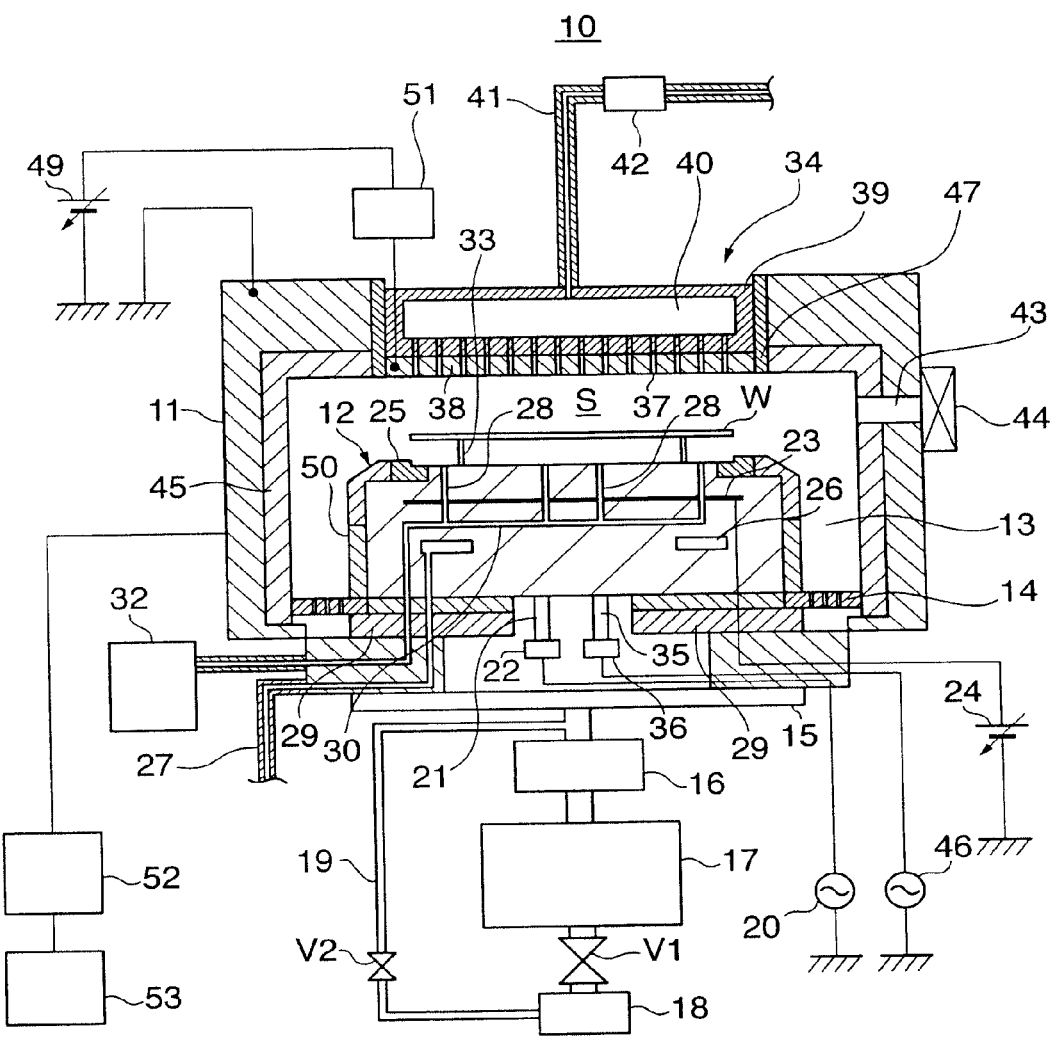
FIG. 1 is a sectional view schematically showing the construction of a plasma processing apparatus according to a first embodiment of the present invention.

FIG. 1 is a sectional view schematically showing the construction of a plasma processing apparatus according to a first embodiment of the present invention. The plasma processing apparatus is constructed such as to carry out RIE (reactive ion etching) processing or ashing processing on a semiconductor wafer W as a substrate.

As shown in FIG. 1, the plasma processing apparatus 10 has a cylindrical substrate processing chamber 11, the substrate processing chamber 11 having a processing space S therein. A cylindrical susceptor 12 (first electrode) is disposed in the substrate processing chamber 11 as a stage on which is mounted a semiconductor wafer W (hereinafter referred to merely as a "wafer W") having a diameter of, for example, 300 mm. An inner wall surface of the substrate processing chamber 11 is covered with a side wall member 45. The side wall member 45 is made of aluminum, a surface thereof facing the processing space S being coated with yttria ($Y_2O_3$). Moreover, the substrate processing chamber 11 is electrically grounded, so that the side wall member 45 is at ground potential. The susceptor 12 is installed via an insulating member 29 on a bottom portion of the substrate processing chamber 11. A side face of the susceptor 12 is covered with a susceptor side face covering member 50.

In the plasma processing apparatus 10, an exhaust path 13 that acts as a flow path through which gas molecules above the susceptor 12 are exhausted out of the substrate processing chamber 11 is formed between an inner side wall of the substrate processing chamber 11 and the side face of the susceptor 12. An annular exhaust plate 14 that prevents leakage of plasma is disposed part way along the exhaust path 13. A space in the exhaust path 13 downstream of the exhaust plate 14 bends round below the susceptor 12, and is communicated with an automatic pressure control valve (hereinafter referred to as the "APC valve") 15, which is a variable butterfly valve. The APC valve 15 is connected via an isolator 16 to a turbo-molecular pump (hereinafter referred to as the "TMP") 17, which is an exhausting pump for evacuation. The TMP 17 is connected via a valve V1 to a dry pump (hereinafter referred to as the "DP") 18, which is also an exhausting pump. The exhaust flow path comprised of the APC valve 15, the isolator 16, the TMP 17, the valve V1, and the DP 18 is used for controlling the pressure in the substrate processing chamber 11, more specifically the processing space S, using the APC valve 15, and also for reducing the pressure in the substrate processing chamber 11 down to a substantially vacuum state using the TMP 17 and the DP 18.

Moreover, piping 19 is connected from between the isolator 16 and the APC valve 15 to the DP 18 via a valve V2. The piping 19 and the valve V2 bypass the TMP 17, and are used for roughing the substrate processing chamber 11 using the DP 18.

A radio frequency power source 20 is connected to the susceptor 12 via a feeder rod 21 and a matcher 22. The radio frequency power source 20 supplies radio frequency electrical power of a relatively high frequency, for example 40 MHz, to the susceptor 12. The susceptor 12 thus acts as a lower electrode. The matcher 22 reduces reflection of the radio frequency electrical power from the susceptor 12 so as to maximize the efficiency of the supply of the radio frequency electrical power into the susceptor 12. The susceptor 12 applies into the processing space S the 40 MHz radio frequency electrical power supplied from the radio frequency power source 20.

Moreover, another radio frequency power source 46 is connected to the susceptor 12 via a feeder rod 35 and a matcher 36. The other radio frequency power source 46 supplies radio frequency electrical power of a frequency lower than that of the radio frequency electrical power supplied by the radio frequency power source 20, for example 3.13 MHz, to the susceptor 12. The matcher 36 has a similar function to the matcher 22.

A radio frequency (3.13 MHz) potential arises on a surface of the susceptor 12 and a surface of the susceptor side face covering member 50 due to the supplied 3.13 MHz radio frequency electrical power. A potential that fluctuates at 3.13 MHz thus arises on the surface of the susceptor 12 and the surface of the susceptor side face covering member 50, and hence of positive ions in the plasma produced in the processing space S, positive ions corresponding in number to a potential difference between the plasma in the processing space S and the surface of the susceptor 12 collides with the surface of the susceptor 12, and likewise for the susceptor side face covering member 50. Polymer that has become attached to the surface of the susceptor 12 and the surface of the susceptor side face covering member 50 is removed through collisions with the positive ions (sputtering). Furthermore, a potential due to the 40 MHz radio frequency electrical power also arises on the surface of the susceptor 12 and the surface of the susceptor side face covering member 50, but positive ions cannot follow a potential difference fluctuating at 40 MHz, and hence the potential difference produced due to the 40 MHz radio frequency electrical power is small, and thus the energy of positive ions colliding with the surface of the susceptor 12 and the surface of the susceptor side face covering member 50 is low.

A disk-shaped ESC electrode plate 23 comprised of an electrically conductive film is provided in an upper portion of the susceptor 12. An ESC DC power source 24 is electrically connected to the ESC electrode plate 23. A wafer W is attracted to and held on an upper surface of the susceptor 12 through a Johnsen-Rahbek force or a Coulomb force generated by a DC voltage applied to the ESC electrode plate 23 from the ESC DC power source 24. Moreover, an annular focus ring 25 is provided on an upper portion of the susceptor 12 so as to surround the wafer W attracted to and held on the upper surface of the susceptor 12. The focus ring 25 is exposed to the processing space S, and focuses plasma in the processing space S toward a front surface of the wafer W, thus improving the efficiency of the RIE processing or ashing processing.

An annular coolant chamber 26 that extends, for example, in a circumferential direction of the susceptor 12 is provided inside the susceptor 12. A coolant, for example cooling water or a Galden (registered trademark) fluid, at a predetermined temperature is circulated through the coolant chamber 26 via coolant piping 27 from a chiller unit (not shown). A processing temperature of the wafer W attracted to and held on the upper surface of the susceptor 12 is controlled through the temperature of the coolant.

A plurality of heat-transmitting gas supply holes 28 are opened to a portion of the upper surface of the susceptor 12 on which the wafer W is attracted and held (hereinafter referred to as the "attracting surface"). The heat-transmitting gas supply holes 28 are connected to a heat-transmitting gas supply unit 32 by a heat-transmitting gas supply line 30 provided inside the susceptor 12. The heat-transmitting gas supply unit 32 supplies helium gas as a heat-transmitting gas via the heat-transmitting gas supply holes 28 into a gap between the attracting surface of the susceptor 12 and a rear surface of the wafer W.

A plurality of pusher pins 33 are provided in the attracting surface of the susceptor 12 as lifting pins that can be made to project out from the upper surface of the susceptor 12. The pusher pins 33 are connected to a motor (not shown) by a ball screw (not shown), and can be made to project out from the attracting surface of the susceptor 12 through rotational motion of the motor, which is converted into linear motion by the ball screw. The pusher pins 33 are housed inside the susceptor 12 when a wafer W is being attracted to and held on the attracting surface of the susceptor 12 so that the wafer W can be subjected to the RIE processing or ashing processing, and are made to project out from the upper surface of the susceptor 12 so as to lift the wafer W up away from the susceptor 12 when the wafer W is to be transferred out from the substrate processing chamber 11 after having been subjected to the RIE processing or ashing processing.

A gas introducing shower head 34 is disposed in a ceiling portion of the substrate processing chamber 11 such as to face the susceptor 12. The gas introducing shower head 34 is comprised of an electrode plate support 39 made of an electrically conductive material having a buffer chamber 40 formed therein, and an upper electrode plate 38 (second electrode) which is supported by the electrode plate support 39. A lower surface (exposed portion) of the upper electrode plate 38 is exposed to the processing space S. The upper electrode plate 38 is a disk-shaped member made of a silicon-based electrically conductive material, for example Si or SiC. A peripheral portion of the upper electrode plate 38 and a peripheral portion of the electrode plate support 39 are covered with an annular insulating member 47 made of an insulating material. That is, the upper electrode plate 38 and the electrode plate support 39 are electrically insulated by the insulating member 47 from the wall of the substrate processing chamber 11 which is at ground potential, and from the susceptor 12 to which radio frequency electrical power is supplied.

A processing gas introducing pipe 41 is connected from a processing gas supply unit (not shown) to the buffer chamber 40 in the electrode plate support 39. A piping insulator 42 is disposed part way along the processing gas introducing pipe 41. Moreover, the gas introducing shower head 34 has therein a plurality of gas holes 37 that communicate the buffer chamber 40 to the processing space S. A processing gas supplied from the processing gas introducing pipe 41 into the buffer chamber 40 is supplied by the gas introducing shower head 34 into the processing space S via the gas holes 37.

The upper electrode plate 38 is electrically connected to a DC power source 49 via a radio frequency filter 51. The DC power source 49 applies a negative DC voltage to the upper electrode plate 38. The value of the DC voltage applied to the upper electrode plate 38 by the DC power source 49 is determined by a controller 52, described below.

A transfer port 43 for the wafers W is provided in the side wall of the substrate processing chamber 11 in a position at the height of a wafer W that has been lifted up from the susceptor 12 by the pusher pins 33. A gate valve 44 for opening and closing the transfer port 43 is provided in the transfer port 43.

In the substrate processing chamber 11 of the plasma processing apparatus 10, through the susceptor 12 applying radio frequency electrical power into the processing space S which is the space between the susceptor 12 and the upper electrode plate 38 as described above, the processing gas supplied from the gas introducing shower head 34 into the processing space S is turned into high-density plasma so that positive ions and radicals are produced, whereby the wafer W is subjected to the RIE processing or ashing processing by the positive ions and radicals.

Moreover, the plasma processing apparatus 10 further has the controller 52, which controls operation of component elements of the plasma processing apparatus 10, a database 53 in which various types of data are stored, and an input section, for example an operation panel (not shown) for an operator to input processing conditions and so on.

When a wafer W is subjected to RIE processing in the plasma processing apparatus 10 described above, if a deposit-producing processing gas such as a mixed gas of $C_4F_8$ gas and argon gas is used, then reaction product produced from the processing gas becomes attached as polymer to the lower surface of the upper electrode plate 38, the surface of the susceptor 12, the surface of the side wall member 45, and the surface of the susceptor side face covering member 50. The attached polymer forms a deposit film on each of these surfaces. Here, the polymer attached to the surface of the susceptor 12 and the surface of the susceptor side face covering member 50 is removed through collisions with positive ions as described earlier. Moreover, the side wall member 45 is at ground potential, and hence positive ions also collide with the side wall member 45. The polymer attached to the surface of the side wall member 45 is thus also removed. However, in the case that a DC voltage is not applied to the upper electrode plate 38, because the upper electrode plate 38 is electrically insulated, a potential difference between the lower surface of the upper electrode plate 38 and the plasma in the processing space S is reduced, and hence ions do not collide with the lower surface of the upper electrode plate 38, and thus the polymer attached to the lower surface of the upper electrode plate 38 is not removed.

In the present embodiment, a potential difference is thus produced between the lower surface of the upper electrode plate 38 and the plasma in the processing space S so that polymer attached to the lower surface of the upper electrode plate 38 is removed through collisions with positive ions. Specifically, the DC power source 49 applies a negative DC voltage to the upper electrode plate 38.

Figure 2:
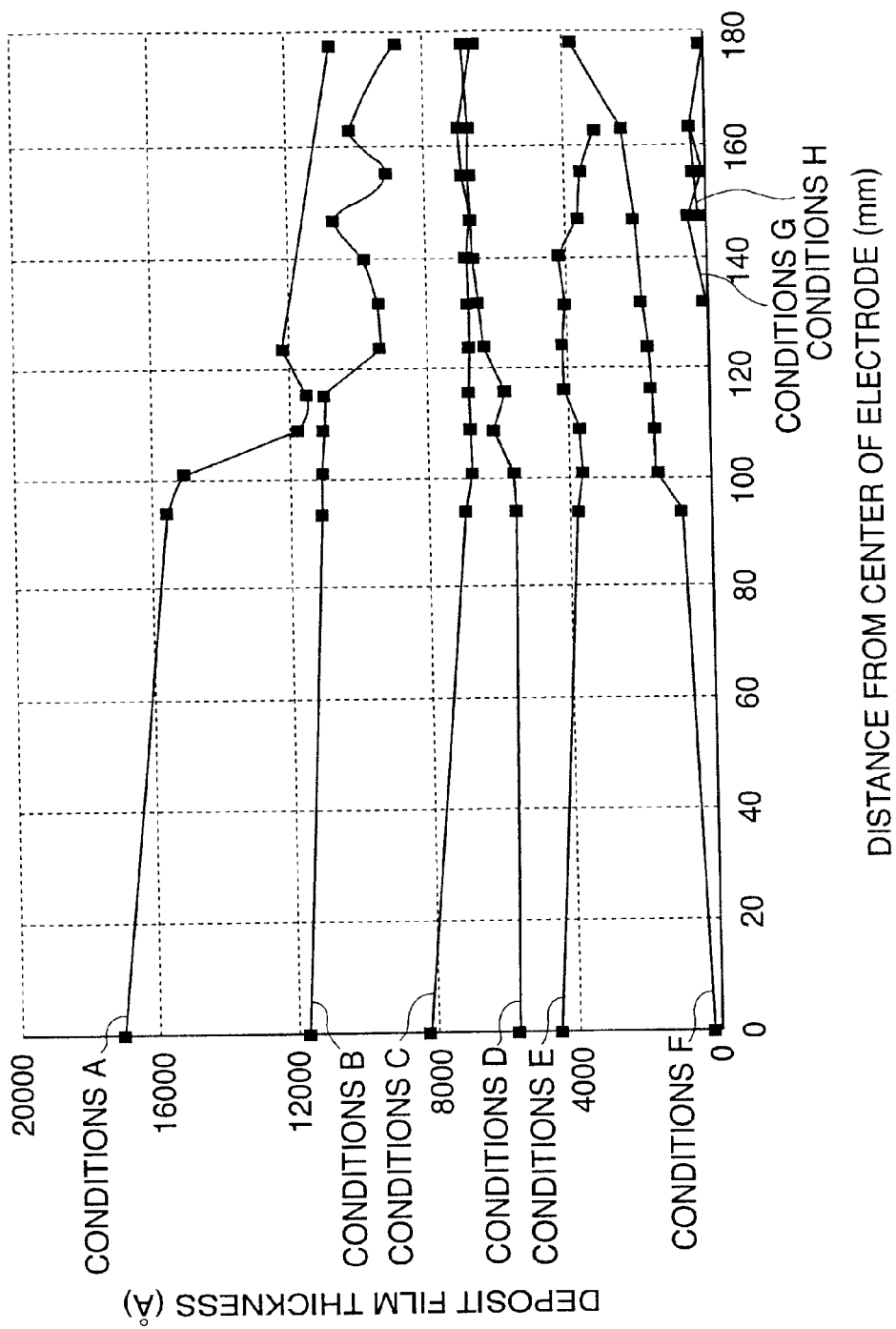
FIG. 2 is a graph showing the relationship between processing conditions and a deposit film thickness on a lower surface of an upper electrode plate.

To investigate what value of negative DC voltage to apply to the upper electrode plate 38, the present inventors first produced plasma from the processing gas in the processing space S without applying a DC voltage to the upper electrode plate 38 in the plasma processing apparatus 10, whereupon it was ascertained that the amount of polymer becoming attached to the lower surface of the upper electrode plate 38 changes in accordance with at least one of the processing conditions for the RIE processing, for example the type of the processing gas introduced into the processing space S, the magnitude of the radio frequency electrical power supplied to the susceptor 12, and the pressure in the processing space S. Specifically, the present inventors ascertained that the deposit film thickness on the lower surface of the upper electrode plate 38 changes upon changing the processing conditions (conditions A to H) (FIG. 2). This is because if a processing condition is changed, specifically the pressure in the processing space S and/or the magnitude of the radio frequency electrical power is changed, then the potential difference between the lower surface of the upper electrode plate 38 and the plasma in the processing space S changes accordingly.

As described above, the deposit film thickness on the lower surface of the upper electrode plate 38 changes in accordance with the processing conditions for the RIE processing. In the present embodiment, the value of the negative DC voltage to be applied to the upper electrode plate 38 is thus determined in accordance with the processing conditions. Specifically, the deposit film thickness under each set of processing conditions in the plasma processing apparatus 10 is measured in advance, and the relationship between the processing conditions and the deposit film thickness (hereinafter referred to as the "processing condition-deposit film thickness relationship") is stored in the database 53; furthermore, for each of a plurality of deposit film thicknesses, the value of the negative DC voltage at which the deposit film can be removed but the upper electrode plate 38 itself is not sputtered is determined using the plasma processing apparatus 10, and the relationship between the thickness of the deposit film to be removed and the required value of the negative DC voltage (hereinafter referred to as the "deposit film thickness-DC voltage value relationship") is also stored in the database 53. The controller 52 then determines the value of the negative DC voltage to be applied to the upper electrode plate 38 from the processing conditions for the RIE processing to be carried out, based on the processing condition-deposit film thickness relationship and the deposit film thickness-DC voltage value relationship stored in the database 53.

Next, a plasma processing method according to the first embodiment of the present invention will be described.

Figure 3:
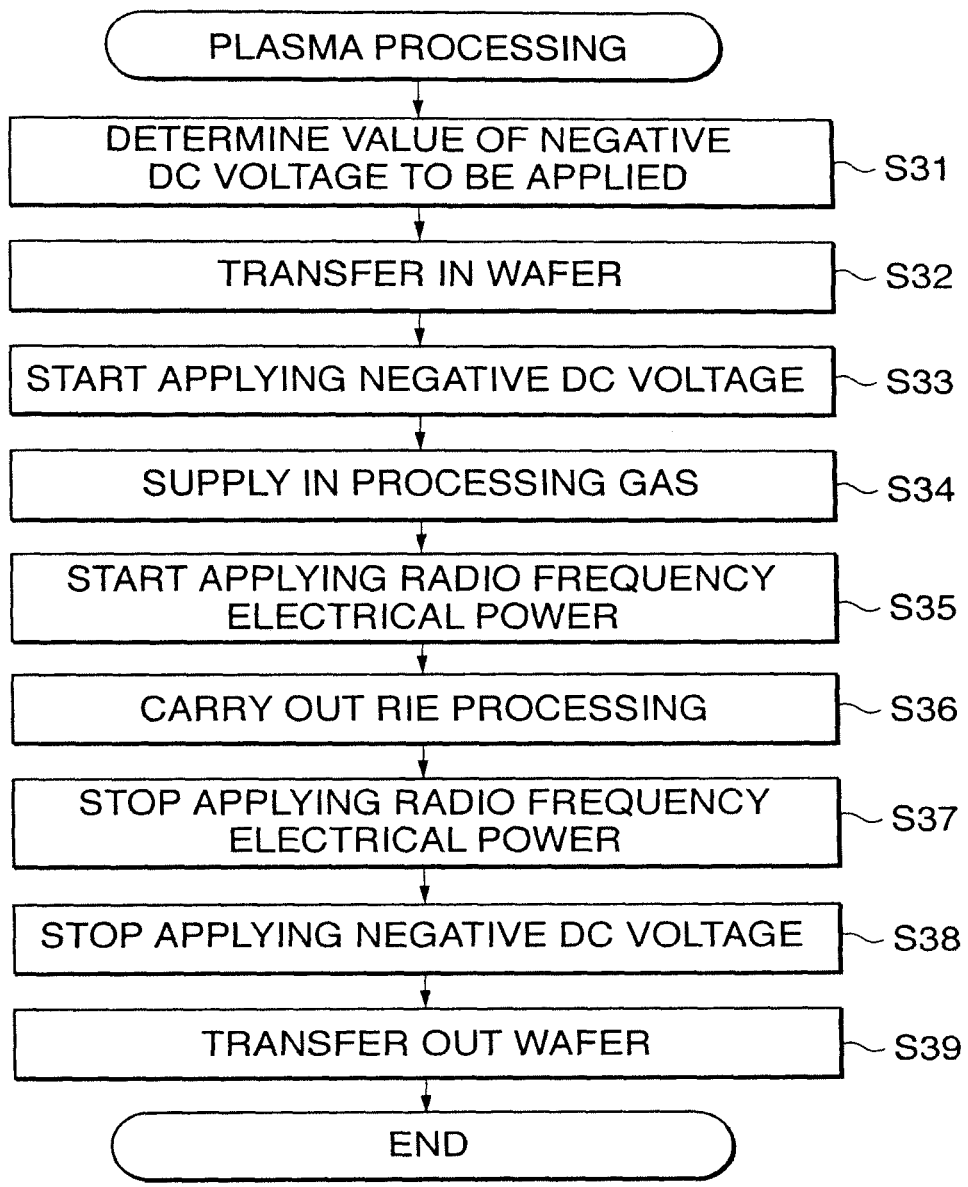
FIG. 3 is a flowchart of a plasma processing method according to the first embodiment of the present invention.

FIG. 3 is a flowchart of the plasma processing method according to the first embodiment of the present invention.

As shown in FIG. 3, first, upon the operator using the operation panel to input the processing conditions, for example a desired processing gas type, radio frequency electrical power magnitude, and processing space S pressure, for the RIE processing to be carried out by the plasma processing apparatus 10, the controller 52 determines the value of the negative DC voltage to be applied to the upper electrode plate 38 from at least one of the desired processing gas type, radio frequency electrical power magnitude, and processing space S pressure, based on the processing condition-deposit film thickness relationship and the deposit film thickness-DC voltage value relationship stored in the database 53 (step S31) (voltage value determining step).

Next, a wafer W is transferred into the substrate processing chamber 11 (step S32), the wafer W is attracted to and held on the attracting surface of the susceptor 12, and the pressure in the substrate processing chamber 11 is reduced to the pressure in the inputted processing conditions, and then the DC power source 49 starts to apply a negative DC voltage of the determined value to the upper electrode plate 38 (step S33) (DC voltage application step), the gas introducing shower head 34 supplies the processing gas into the processing space S (step S34), and the radio frequency power source 20 and the other radio frequency power source 46 supply 40 MHz and 3.13 MHz radio frequency electrical power respectively to the susceptor 12, so that the susceptor 12 starts to apply 40 MHz and 3.13 MHz radio frequency electrical power into the processing space S (step S35). At this time, the processing gas is turned into high-density plasma, so that positive ions and radicals are produced in the processing space S. The wafer W is subjected to RIE processing by the positive ions and radicals (step S36).

While the plasma is being produced in the processing space S, reaction product is produced from the processing gas and becomes attached as polymer to the lower surface of the upper electrode plate 38. However, because the negative DC voltage is being applied to the upper electrode plate 38, a potential difference arises between the lower surface of the upper electrode plate 38 and the plasma in the processing space S, so that positive ions collide with the lower surface of the upper electrode plate 38. As a result, the polymer attached to the lower surface of the upper electrode plate 38 is removed.

Upon the RIE processing on the wafer W being completed, the supply of the radio frequency electrical power to the susceptor 12 by each of the radio frequency power source 20 and the other radio frequency power source 46 is stopped, so that the application of the radio frequency electrical power into the processing space S is stopped (step S37). At this time, the plasma in the processing space S disappears.

Next, the application of the negative DC voltage to the upper electrode plate 38 by the DC power source 49 is stopped (step S38), the pressure in the substrate processing chamber 11 is raised to atmospheric pressure, and the wafer W that has been subjected to the RIE processing is transferred out from the substrate processing chamber 11 (step S39), whereupon the present process comes to an end.

According to the process of FIG. 3 described above, a negative DC voltage is applied to the upper electrode plate 38, which is electrically insulated. As a result, a potential difference is produced between the plasma in the processing space S and the lower surface of the upper electrode plate 38, and hence positive ions collide with the lower surface of the upper electrode plate 38. Polymer can thus be removed from the lower surface of the upper electrode plate 38.

In the process of FIG. 3, the value of the negative DC voltage to be applied to the upper electrode plate 38 is determined from at least one of the type of the gas to be introduced into the processing space S, the magnitude of the radio frequency electrical power to be supplied to the susceptor 12, and the pressure in the processing space S, based on the processing condition-deposit film thickness relationship and the deposit film thickness-DC voltage value relationship stored in the database 53. The deposit film thickness on the lower surface of the upper electrode plate 38 is related to the at least one of the above gas type, the above radio frequency electrical power magnitude, and the above pressure. Moreover, the value of the negative DC voltage in the deposit film thickness-DC voltage value relationship stored in the database 53 is a negative DC voltage value at which the deposit film can be removed but the upper electrode plate 38 itself is not sputtered. As a result, the amount of sputtering by positive ions colliding with the lower surface of the upper electrode plate 38 can be suitably controlled, and hence the polymer can be suitably removed from the upper electrode plate 38, and yet wear of the upper electrode plate 38 can be prevented.

Moreover, in the process of FIG. 3, the negative DC voltage is applied to the upper electrode plate 38 while the radio frequency electrical power is being supplied to the susceptor 12 by the radio frequency power source 20 and the other radio frequency power source 46. While the radio frequency electrical power is being supplied to the susceptor 12, plasma is produced in the processing space S, and hence reaction product is produced from the processing gas and becomes attached as polymer to the lower surface of the upper electrode plate 38. However, because the negative DC voltage is being applied to the upper electrode plate 38, the polymer is removed through collisions with positive ions. As a result, the polymer can be reliably removed from the upper electrode plate 38.

In the process of FIG. 3 described above, the absolute value of the negative DC voltage applied to the upper electrode plate 38 is preferably in a range of 0 V to 2000 V, which is a value such as not to affect the plasma, more preferably 50 V to 200 V.

Note that the negative DC voltage applied to the upper electrode plate 38 may also be used to control the plasma distribution or the like, in which case the value of the negative DC voltage is not limited to being as above.

In the present embodiment described above, polymer attached to the lower surface of the upper electrode plate 38 is removed through the application of the negative DC voltage. However, the object of removal is not limited to this. For example, an oxide film formed on the lower surface of the upper electrode plate 38 may also be removed through the application of the negative DC voltage.

Moreover, in the present embodiment described above, the value of the negative DC voltage to be applied is determined in accordance with the processing conditions for the RIE processing to be carried out on the wafer W before the RIE processing is carried out. However, the value of the negative DC voltage may also be changed as appropriate during the RIE processing in accordance with the luminescence of the plasma in the processing space S or the amount of polymer attached to the lower surface of the upper electrode plate 38. An example of a method of measuring the amount of polymer attached to the lower surface of the upper electrode plate 38 is a method in which part of an optical fiber having both ends thereof disposed outside the substrate processing chamber 11 is exposed to the interior of the substrate processing chamber 11, and the transmissivity of the optical fiber is monitored. The transmissivity of the optical fiber changes upon polymer becoming attached to the optical fiber, and hence the amount of polymer attached to the lower surface of the upper electrode plate 38 can be measured using this method.

In the present embodiment described above, the plasma processing apparatus 10 has the controller 52 and the database 53. However, an external server and database connected to the plasma processing apparatus 10 may alternatively serve these functions.

Next, a plasma processing apparatus according to a second embodiment of the present invention will be described.

The present embodiment is basically the same as the first embodiment described above in terms of construction and operation, differing from the first embodiment in that there is a switch between the DC power source and the radio frequency filter. Features of the construction and operation that are the same as in the first embodiment will thus not be described, only features that are different from those of the first embodiment being described below.

Figure 4:
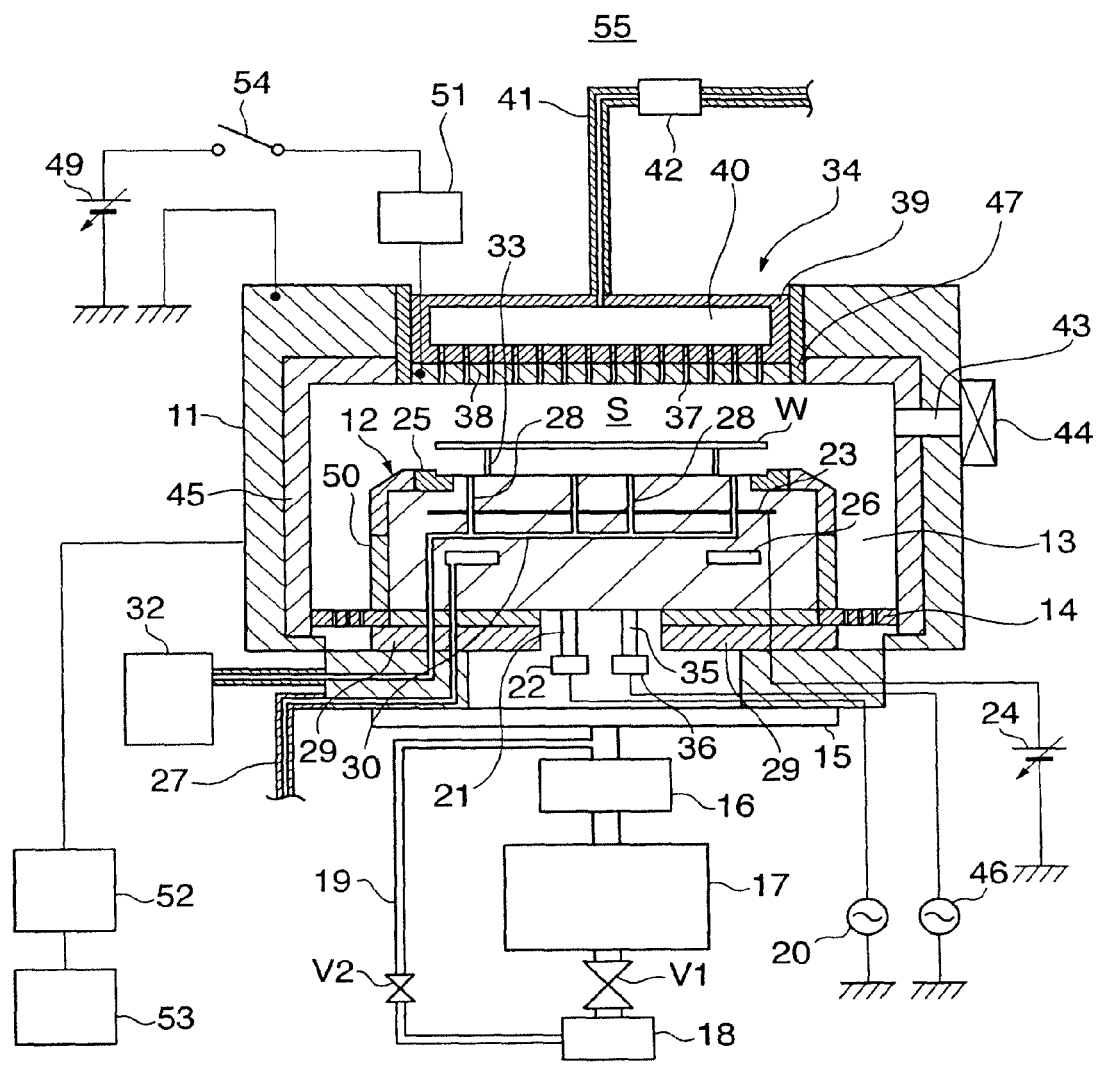
FIG. 4 is a sectional view schematically showing the construction of a plasma processing apparatus according to a second embodiment of the present invention.

FIG. 4 is a sectional view schematically showing the construction of the plasma processing apparatus according to the second embodiment.

As shown in FIG. 4, the plasma processing apparatus 55 has a switch 54 (switching device) disposed between the DC power source 49 and the radio frequency filter 51.

When the switch 54 is on, the upper electrode plate 38 is electrically connected to the DC power source 49 via the radio frequency filter 51, so that the DC power source 49 applies a DC voltage to the upper electrode plate 38. The value of the DC voltage applied to the upper electrode plate 38 by the DC power source 49 is determined by the controller 52. When the switch 54 is off, the upper electrode plate 38 is electrically "floating". The switching on and off of the switch 54 is controlled by the controller 52 as described below.

Figure 5:
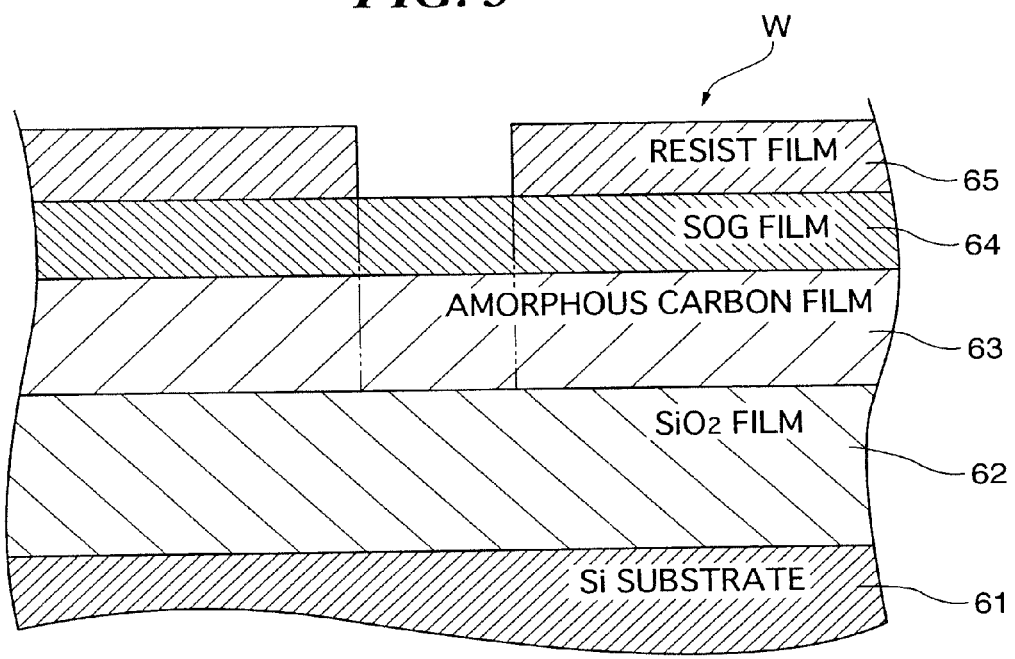
FIG. 5 is a sectional view schematically showing the cross-sectional form of a wafer to be processed by the plasma processing apparatus shown in FIG. 4.

FIG. 5 is a sectional view schematically showing the cross-sectional form of a wafer W to be processed by the plasma processing apparatus 55 shown in FIG. 4. In the present embodiment, the case that a multi-layer resist film is formed on the wafer W is described.

As shown in FIG. 5, the multi-layer resist film on the wafer W is first produced by forming, on an $SiO_2$ film 62 (inorganic film) to be processed that has been formed on an Si substrate 61, an amorphous carbon film 63 (organic film) that can be selectively etched relative to the $SiO_2$ film 62, an SOG film 64 (inorganic film) that can be selectively etched relative to the amorphous carbon film 63, and a resist film 65 in this order. The SOG film 64 is, for example, made of $SiO_2$ or SiOC.

In the present embodiment, a processing process is carried out continuously in a single chamber on the wafer W on which the multi-layer resist film has been formed as described above. Specifically, the resist film 65 is patterned by photolithography, and the SOG film 64 is etched using the resist film 65 as a mask, thus transferring the pattern of the resist film 65 onto the SOG film 64. Next, the amorphous carbon film 63 is etched using the patterned SOG film 64 as a mask, thus transferring the pattern of the SOG film 64 onto the amorphous carbon film 63. Processing of the $SiO_2$ film 62 that is the object of the processing is then carried out using the patterned amorphous carbon film 63 as a mask.

More specifically, in each of the etching of the SOG film 64 and the etching of the $SiO_2$ film 62, the pressure in the substrate processing chamber 11 into which the wafer W has been transferred is set to a pressure in processing conditions that have been inputted using the operation panel or the like, a DC voltage of a value determined based on the inputted processing conditions is applied to the upper electrode plate 38, a CF type processing gas such as $C_4F_8$ is supplied into the processing space S from the gas introducing shower head 34, and 40 MHz radio frequency electrical power and 3.13 MHz radio frequency electrical power supplied to the susceptor 12 from the radio frequency power source 20 and the other radio frequency power source 46 respectively are applied into the processing space S, so as to turn the supplied processing gas into high-density plasma, whereby positive ions and radicals are produced, the wafer W being subjected to RIE processing by the positive ions and radicals.

On the other hand, in the etching of the amorphous carbon film 63, the switch 54 is turned off based on the inputted processing conditions so as to put the upper electrode plate 38 into a floating state, and the pressure in the substrate processing chamber 11 into which the wafer W has been transferred is set to a pressure in the inputted processing conditions, and then a processing gas not containing F such as $O_2$, CO, $N_2$, or $H_2$ is supplied into the processing space S from the gas introducing shower head 34, and radio frequency electrical power of frequency not less than 40 MHz supplied to the susceptor 12 from the radio frequency power source 20 is applied into the processing space S, so as to turn the supplied processing gas into high-density plasma, whereby positive ions and radicals are produced, the wafer W being subjected to RIE processing by the positive ions and radicals.

Next, a plasma processing method according to the second embodiment of the present invention will be described.

Figure 6:
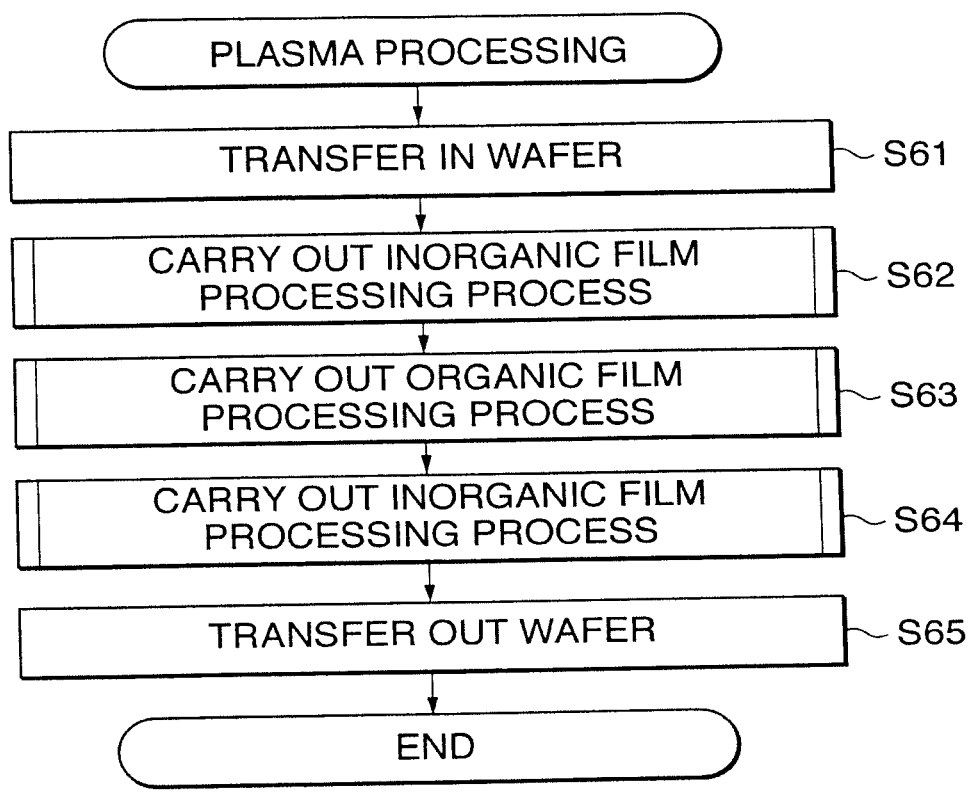
FIG. 6 is a flowchart of a plasma processing method according to the second embodiment of the present invention.

FIG. 6 is a flowchart of the plasma processing method according to the second embodiment of the present invention.

In the plasma processing method of FIG. 6, first, the operator uses the operation panel to input processing conditions, for example desired processing gas type, radio frequency electrical power magnitude, and processing space S pressure, for the RIE processing to be carried out by the plasma processing apparatus 55.

Next, a wafer W is transferred into the substrate processing chamber 11 (step S61), and the wafer W is attracted to and held on the attracting surface of the susceptor 12, then an inorganic film processing process (step S62), an organic film processing process (step S63), and an inorganic film processing process (step S64), described in detail below, are carried out in this order, and then the pressure in the substrate processing chamber 11 is raised to atmospheric pressure, and the wafer W that has been subjected to the RIE processing in the respective processing processes is transferred out from the substrate processing chamber 11 (step S65), whereupon the present process comes to an end.

In the inorganic film processing process of step S62 (inorganic film processing step), the SOG film 64 is etched, and at this time the pattern of the resist film 65 is transferred onto the SOG film 64. In the organic film processing process of step S63 (organic film processing step), the amorphous carbon film 63 is etched, the pattern of the SOG film 64 being transferred onto the amorphous carbon film 63. In the inorganic film processing process of step S64 (inorganic film processing step), the $SiO_2$ film 62 is etched, and at this time the patterned amorphous carbon film 63 acts as a mask. As a result, an $SiO_2$ film 62 patterned in a desired pattern can be obtained.

Figure 7:
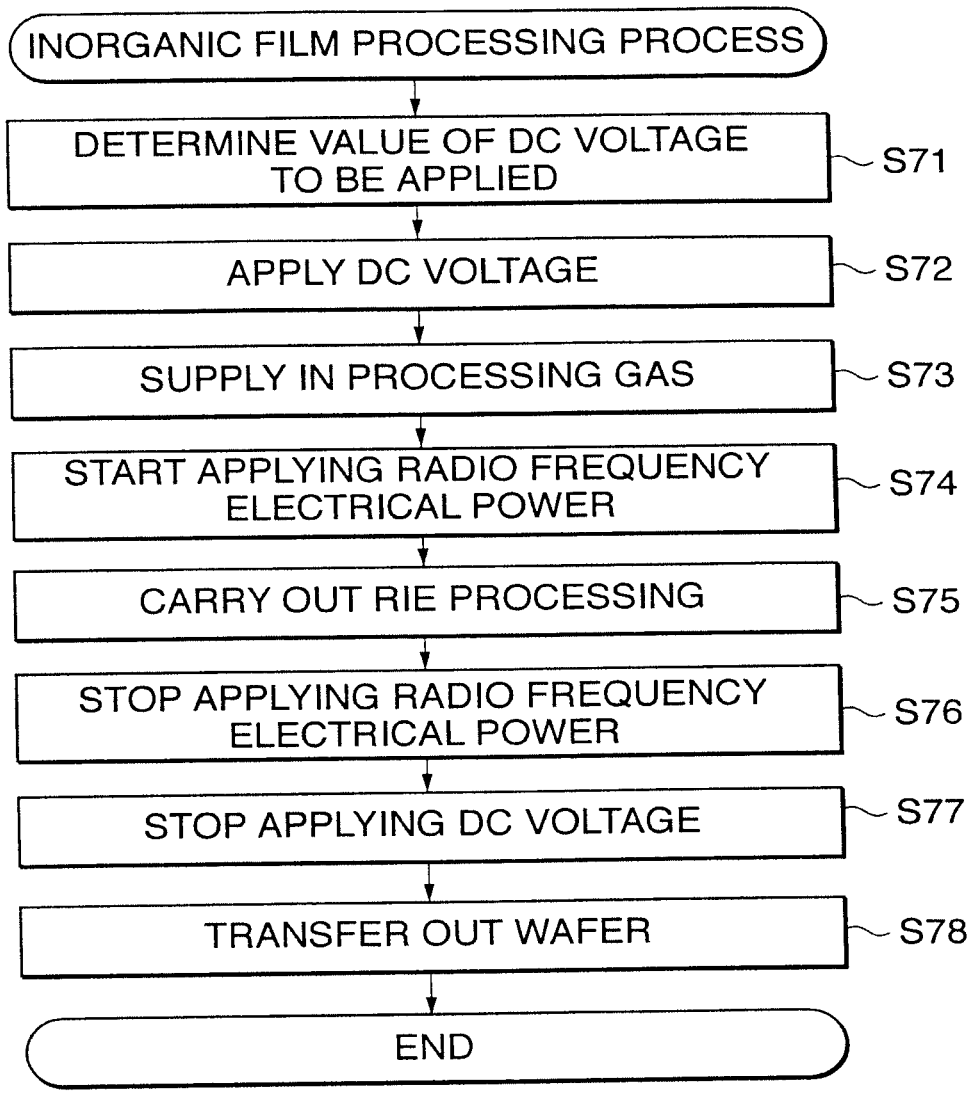
FIG. 7 is a flowchart showing a procedure for an inorganic film processing process of each of steps S62 and S64 appearing in FIG. 6.

FIG. 7 is a flowchart showing a procedure for the inorganic film processing process of each of steps S62 and S64 appearing in FIG. 6.

As shown in FIG. 7, first, the controller 52 determines the value of the DC voltage to be applied to the upper electrode plate 38 based on the processing conditions for the RIE processing inputted by the operator (step S71).

Next, the pressure in the substrate processing chamber 11 into which the wafer W has been transferred is reduced or raised to the pressure in the inputted processing conditions, the controller 52 turns the switch 54 on, and the DC power source 49 starts to apply a DC voltage of the determined value to the upper electrode plate 38 (step S72) (DC power source connection step). Next, the gas introducing shower head 34 supplies a CF type processing gas such as $C_4F_8$ into the processing space S (step S73), and the radio frequency power source 20 and the other radio frequency power source 46 supply 40 MHz and 3.13 MHz radio frequency electrical power respectively to the susceptor 12, so that the susceptor 12 starts to apply 40 MHz and 3.13 MHz radio frequency electrical power into the processing space S (step S74). At this time, the processing gas is turned into high-density plasma, so that positive ions and radicals are produced in the processing space S. The wafer W is subjected to RIE processing by the positive ions and radicals (step S75).

In step S75, because the DC voltage is being applied to the upper electrode plate 38, a potential difference arises between the lower surface of the upper electrode plate 38 and the plasma in the processing space S. Positive ions are drawn onto the upper electrode plate 38 due to the potential difference, whereby the upper electrode plate 38 is sputtered. As described earlier, if such an electrode plate made of a silicon-based material is sputtered, then high selectivity of an inorganic film relative to a mask film can be achieved in the inorganic film processing. Accordingly, in step S75, a high selectivity relative to the resist film 65 can be secured in the etching of the SOG film 64, and a high selectivity relative to the amorphous carbon film 63 can be secured in the etching of the $SiO_2$ film 62.

It is difficult to clearly explain the mechanism of the effect due to the sputtering of the electrode plate made of the silicon-based material, but as a result of carrying out assiduous studies, the present inventors have come up with the two hypotheses described below.

(1) Through the sputtering of the electrode plate made of the silicon-based material, the silicon-based material files off and thus accumulates on the mask film. After that, even if positive ions and radicals from the plasma reach the mask film, these positive ions and radicals are consumed in etching of the accumulated silicon-based material, and hence the mask film is hardly etched.

(2) In etching by a CF type gas plasma, CF type deposit is produced as reaction product and accumulates on the mask film, thus forming a deposit film. Moreover, during the sputtering of the electrode plate, fluorine ions and fluorine radicals from the CF type gas are consumed. The CF type deposit produced is thus carbon rich. Due to being carbon rich, the deposit film is strengthened and thus becomes less easily etched. As a result, the deposit film protects the mask film, and hence the mask film is hardly etched.

Next, upon the RIE processing on the wafer W being completed, the supply of the radio frequency electrical power to the susceptor 12 by each of the radio frequency power source 20 and the other radio frequency power source 46 is stopped, so that the application of the radio frequency electrical power into the processing space S is stopped (step S76). At this time, the plasma in the processing space S disappears.

Next, the application of the DC voltage to the upper electrode plate 38 by the DC power source 49 is stopped (step S77), whereupon the present process comes to an end.

According to the inorganic film processing process of FIG. 7, a DC voltage is applied to the upper electrode plate 38. As a result, a potential difference is produced between the plasma in the processing space S and the lower surface of the upper electrode plate 38, and hence positive ions collide with the lower surface of the upper electrode plate 38. That is, the upper electrode plate 38 is sputtered, and hence a high selectivity relative to the resist film 65 can be secured in the etching of the SOG film 64, and a high selectivity relative to the amorphous carbon film 63 can be secured in the etching of the $SiO_2$ film 62.

In the present embodiment, an arrangement in which a DC voltage is applied to the upper electrode plate 38 is adopted. However, an arrangement in which the upper electrode plate 38 is switched from a floating state to a grounded state may be adopted, or an arrangement in which radio frequency electrical power of frequency not more than 27 MHz able to produce a high DC voltage (Vdc) is applied to the upper electrode plate 38 may be adopted.

Figure 8:
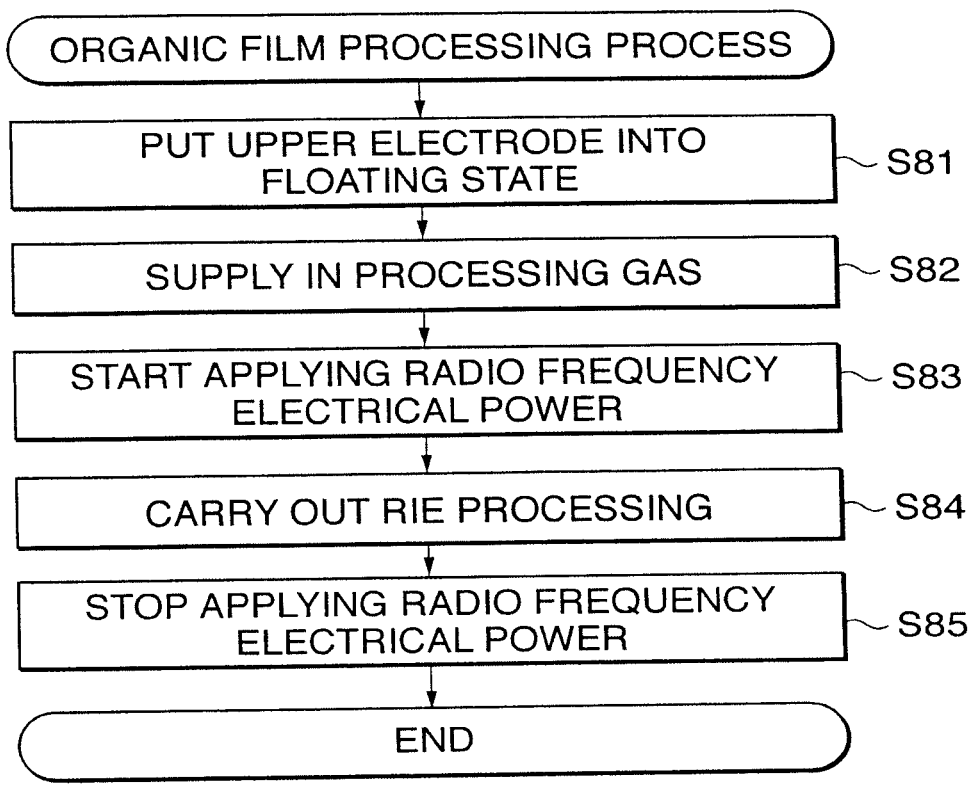
FIG. 8 is a flowchart showing a procedure for an organic film processing process of step S63 appearing in FIG. 6.

FIG. 8 is a flowchart showing a procedure for the organic film processing process of step S63 appearing in FIG. 6.

As shown in FIG. 8, first, based on the processing conditions for the RIE processing inputted by the operator, the controller 52 turns the switch 54 off, thus putting the upper electrode plate 38 into a floating state (step S81).

Next, the pressure in the substrate processing chamber 11 is reduced or raised to the pressure in the inputted processing conditions, the gas introducing shower head 34 supplies a processing gas not containing F such as $O_2$, CO, $N_2$, or $H_2$ into the processing space S (step S82), and the radio frequency power source 20 supplies radio frequency electrical power of frequency not less than 40 MHz to the susceptor 12, so that the susceptor 12 starts to apply radio frequency electrical power of frequency not less than 40 MHz into the processing space S (step S83). At this time, the processing gas is turned into high-density plasma, so that positive ions and radicals are produced in the processing space S. The wafer W is subjected to RIE processing by the positive ions and radicals (step S84).

In the present process, because the processing gas supplied into the processing space S is a gas not containing F, while the plasma is being produced in the processing space S, reaction product is not produced from the processing gas, and hence polymer is not attached to the lower surface of the upper electrode plate 38.

Furthermore, because the upper electrode plate 38 is in a floating state, the upper electrode plate 38 receives charge from the plasma in the processing space S, and there is no outflow of the charge from the upper electrode plate 38, and hence the upper electrode plate 38 is charged up, whereby the potential difference between the lower surface of the upper electrode plate 38 and the plasma in the processing space S is reduced. As a result, the energy of positive ions colliding with the lower surface of the upper electrode plate 38 is reduced, and hence the lower surface of the upper electrode plate 38 is not sputtered. Silicon-based material thus does not fly off from the upper electrode plate 38, and hence the silicon-based material does not accumulate on the wafer W. Residue can thus be prevented from being produced on the wafer W.

Upon the RIE processing on the wafer W being completed, the supply of the radio frequency electrical power to the susceptor 12 by the radio frequency power source 20 is stopped, so that the application of the radio frequency electrical power into the processing space S is stopped (step S85). At this time, the plasma in the processing space S disappears, whereupon the present process comes to an end.

According to the organic film processing process of FIG. 8, the upper electrode plate 38 is put into a floating state. As a result, the potential difference between the plasma in the processing space S and the lower surface of the upper electrode plate 38 is reduced, and hence the energy of positive ions colliding with the lower surface of the upper electrode plate 38 is reduced. The lower surface of the upper electrode plate 38 is thus not sputtered, and hence the silicon-based material of the upper electrode plate 38 can be prevented from accumulating on the wafer.

In the present embodiment, an arrangement in which the upper electrode plate 38 is put into a floating state is adopted. However, an arrangement in which the potential on the upper electrode plate 38 is made to be not more than 50 eV, i.e. not more than a threshold value at which the sputtering yield of the silicon-based material of the upper electrode plate 38 rises, may be adopted.

According to the plasma processing of FIG. 6, a high selectivity relative to the resist film 65 can be secured in the etching of the SOG film 64, and a high selectivity relative to the amorphous carbon film 63 can be secured in the etching of the $SiO_2$ film 62, and moreover residue can be prevented from being produced on the wafer W in the etching of the amorphous carbon film 63. The inorganic film processing process and the organic film processing process can thus be carried out on the wafer W as a continuous process in the same plasma processing apparatus.

In the present embodiment described above, the plasma processing apparatus 55 has the controller 52 and the database 53. However, an external server and database connected to the plasma processing apparatus 55 may alternatively serve these functions.

The substrates subjected to the RIE processing or the like in the plasma processing apparatus 10 or 55 described above are not limited to being semiconductor wafers for semiconductor devices, but rather may also be any of various substrates used in LCDs (liquid crystal displays), FPDs (flat panel displays) or the like, photomasks, CD substrates, printed substrates, or the like.

Moreover, it is to be understood that the present invention may also be accomplished by supplying to a system or apparatus a storage medium in which is stored a program code of software that realizes the functions of an embodiment as above, and then causing a computer (or CPU, MPU, etc.) of the system or apparatus to read out and execute the program code stored in the storage medium.

In this case, the program code itself read out from the storage medium realizes the functions of the embodiments, and hence the program code and the storage medium in which the program code is stored constitute the present invention.

The storage medium used for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW or a DVD+RW, a magnetic tape, a nonvolatile memory card, or a ROM. Alternatively, the program code may be downloaded via a network.

Moreover, it is to be understood that the functions of the embodiments can be accomplished not only by executing a program code read out by the computer, but also by causing an OS (operating system) or the like which operates on the computer to perform a part or all of the actual operations based on instructions of the program code.

Furthermore, it is to be understood that the functions of the embodiments can also be accomplished by writing a program code read out from a storage medium into a memory provided on an expansion board inserted into the computer or in an expansion unit connected to the computer and then causing a CPU or the like provided on the expansion board or in the expansion unit to perform a part or all of the actual operations based on instructions of the program code.

What is claimed is:

1. A plasma processing apparatus for performing a method on a substrate having an inorganic film and an organic film formed thereon, the plasma processing apparatus comprising:
   a substrate processing chamber that has therein a processing space into which the substrate is transferred and which carries out the plasma processing on the substrate in the processing space;
   a first electrode that is disposed in the substrate processing chamber and is connected to a radio frequency power source;
   a second electrode that has an exposed portion exposed to the processing space and is electrically insulated from the substrate processing chamber and the first electrode, the exposed portion comprising a silicon-based material;
   wherein the second electrode is connected to a DC power source;
   a switching device disposed between the second electrode and the DC power source,
   and
   a controller configured to control the apparatus to perform:
   a first step of carrying out plasma processing on the inorganic film under a condition where a potential difference between a plasma generated in the processing space and the second electrode is set to a value of the DC power source which enables the exposed portion of the second electrode to be sputtered by the generated plasma, and
   a second step of carrying out plasma processing on the organic film under a condition where the switching device cuts off electrical connection between the second electrode and the DC power source so as to electrically insulate the second electrode in a floating state and the potential difference between the generated plasma and the second electrode is set to a value which avoids the exposed portion of the second electrode from being sputtered by the generated plasma.

2. A plasma processing apparatus as claimed in claim 1, wherein the controller is configured to ground the second electrode.

3. A plasma processing apparatus as claimed in claim 1, wherein the controller is configured to, in the first step, apply a radio frequency electrical power of frequency not more than 27 MHz that produces a desired DC voltage to the second electrode.

4. A plasma processing apparatus as claimed in claim 1, wherein the controller is configured to set a potential on the second electrode to be not more than 50 eV which corresponds to a threshold value at which sputtering yield of the silicon based material rises in the second step.

\* \* \* \* \*